United States Patent [19]
Rein

[11] Patent Number: 5,391,933
[45] Date of Patent: Feb. 21, 1995

[54] DRIVER CIRCUIT FOR GENERATING PULSES

[75] Inventor: Hans-Martin Rein, Witten, Germany

[73] Assignee: Siemens Aktiengesellschaft, Munich, Germany

[21] Appl. No.: 958,703

[22] Filed: Oct. 9, 1992

[30] Foreign Application Priority Data

Nov. 25, 1991 [DE] Germany .................. 4138661

[51] Int. Cl.⁶ .............. H04B 10/04; H03F 3/45; H03K 5/02
[52] U.S. Cl. .................................. 327/108; 327/65
[58] Field of Search ............... 307/270, 494, 268

[56] References Cited

U.S. PATENT DOCUMENTS

| | | |
|---|---|---|
| 3,651,344 | 3/1972 | O'Shea ............ 307/270 |
| 3,906,375 | 9/1975 | Dennison et al. ............ 328/71 |
| 4,346,311 | 8/1982 | Aue et al. ............ 307/268 |
| 4,883,987 | 11/1989 | Fattaruso ............ 307/494 X |
| 4,945,258 | 7/1990 | Picard et al. ............ 307/270 |
| 5,068,544 | 11/1991 | Ishiguro et al. ............ 307/268 |
| 5,285,115 | 2/1994 | Tsuji ............ 307/494 X |

FOREIGN PATENT DOCUMENTS

| | | |
|---|---|---|
| 0100177 | 2/1984 | European Pat. Off. . |
| 1515200 | 1/1968 | France . |
| 2424666 | 11/1979 | France . |
| 4004661 | 9/1991 | Germany . |
| 2026803 | 2/1980 | United Kingdom . |

OTHER PUBLICATIONS

Patent Abstracts of Japan, Publication No. JP5130208 for Japanese Application No. 790037128, Dec. 1980.
Patent Abstracts of Japan, Publication No. JP57186810 for Japanese Application No. 810072960, Sep. 1983.
"Compensation of Zero Offset Voltage in Operational Amplifiers," Krakvoskiy, *Telecommunications and Radio Engineering*, vol. 29/30, No. 9, Sep. 1975, p. 123.
"Minimizing Offset Voltage Drift with Temperature in Monolithic Operational Amplifiers," Erdi, Proceedings of the Nat. Electr. Conference, vol. 25, Dec. 1969, pp. 121-123.

Primary Examiner—Willis R. Wolfe
Attorney, Agent, or Firm—Hill, Steadman & Simpson

[57] ABSTRACT

A driver circuit for producing pulses has first and second, sequentially connected differential amplifier stages and first and second adjustable offset voltage sources. The first offset voltage source is connected to an input of the first differential amplifier stage so that the pulse-duty ratio of a differential signal generated by the first differential amplifier stage is variable by adjusting the first offset voltage. The second offset voltage source is connected to an input of the second differential amplifier stage so that the turn-on voltage of a first transistor in the second differential amplifier stage, which is connected to an output of the driver circuit, can be made smaller by adjustment of the second offset voltage, which simultaneously results in an increase in the turn-off voltage for that transistor. The driver circuit is particularly suited for operating laser diodes in optical transmission systems and for pulse generators in measurement equipment.

9 Claims, 3 Drawing Sheets

DRIVER CIRCUIT FOR GENERATING PULSES

BACKGROUND OF THE INVENTION

1. Field of the Invention

The present invention is directed to a driver circuit for generating pulses of the type used in fast digital transmission systems and in measurement technology.

2. Description of the Prior Art

Pulses having relatively high power which are as symmetrical as possible with respect to a given threshold and to the edge steepness are often required for various types of applications, such as for fast digital transmission systems and in measuring equipment. Such pulses are generated by driver circuits. A driver circuit usually has an output stage containing at least one differential amplifier. During operation of the driver circuit in a differential mode, it is relatively easy to generate pulses which are symmetrical with respect to a given threshold and to the edge steepness. This type of operation, however, is too complicated for many uses.

There are also applications wherein operation in a differential mode is not possible. For example, a laser diode in a transmitter of an optical fiber transmission link cannot be driven with a driver circuit operating in a differential mode. Although the output stage of a laser driver is usually formed by a limiting differential amplifier, pulses for driving a laser diode can only be tapped at one of the two complementary outputs of the differential amplifier. This type of operation is referred to as single-ended operation. The shape of the pulses which are obtained using single-ended operation is often asymmetrical. The pulse shape is necessarily asymmetrical in circuits having bipolar transistors, because the output current pulse occurring when the transistor is turned on has a noticeable overshoot, and moreover the signal edge is more highly delayed at the time of turn-on of the transistor than when the transistor is turned off. Because the collector current cannot change its operational sign, no undershoot occurs in the output current toward the end of the time of turn-off. In the case of a laser driver, asymmetrical pulses lead to a reduction in the length of a transmission link which is possible without a repeater because of the time jitter which occurs.

It is known to improve the symmetry of a pulse generated by single-ended operation of a driver circuit by operating the driver stage of the circuit with smaller input voltage swings. As a result, however, the edge steepness of the pulses is diminished. This results in a possible reduction in the data transmission rate.

It is also known to improve the symmetry of such pulses by including an intentional pre-distortion of the generated pulses using passive components such as, for example, filters. This technique, however, requires a complicated matching of components and does not allow monolithic integration. The optimization of the passive components, moreover, is highly dependent on the transmitted data rate, and on the properties of the driver circuit and its load.

Another known possibility is the use of hybrid components (for example, a 180° hybrid) for adding the two complementary signals at the outputs of the differential amplifier to form a symmetrical signal, given simultaneous inversion of one of these two signals. This technique, however, has the disadvantage of being extremely complicated and not particularly flexible and, moreover, does not allow monolithic integration. Additionally, this known technique results in a limitation of the bandwidth, which is frequently undesirable.

SUMMARY OF THE INVENTION

It is an object of the present invention to provide a circuit for the output stage of a driver circuit which supplies a symmetrical signal in single-ended operation, which is simply constructed and can be easily monolithically integrated, and which generates an output pulse with a shape that can be easily adapted to given requirements.

It is a further object of the present invention to provide such a circuit wherein a one-time setting of the pulse shape can be undertaken which can be used for arbitrary pulse sequences from extremely low to extremely high data rates, which still obtaining steep pulse edges.

It is a further object of the present invention to provide such a circuit wherein the output amplification is easy to regulate.

Another object of the present invention is to provide such a circuit which is suitable for operating a laser diode in a digital transmission system.

Another object of the present invention is to provide such a circuit which is suitable for generating pulses in measuring technology.

The above objects are achieved in an output stage for a driver circuit having first and second limiting differential amplifier stages, connected in sequence. Each differential amplifier stage includes two transistors which are interconnected in the manner of a differential amplifier transistor pair, so that each differential amplifier stage has two complementary inputs and two complementary outputs. The first differential amplifier stage is driven by an input signal so as to generate a differential signal. A first offset voltage source is connected to an input of the first differential amplifier stage so that the pulse-duty ratio of the differential signal can be varied by the first offset voltage. The second differential amplifier stage is driven with the differential signal from the first stage, and generates output signals at its complementary outputs, which constitute the outputs for the output stage. A second offset voltage source is connected to an input of the second differential amplifier stage, so that the turn-on voltage of a first of the transistors in the second differential amplifier stage, which is connected to the first output thereof, can be made smaller by means of the second offset voltage, which simultaneously results in an increase in the turn-off voltage for that transistor. The first output of the second differential amplifier stage is connected to a load.

Any overshoot in the pulse shape which may be caused by the turn-on of the first transistor in the second differential amplifier stage is minimized by the application of the second offset voltage to the input of the second differential amplifier stage. The operational sign of the second offset voltage is selected so that the amplitude of the control voltage becomes smaller when switching on the first transistor, whose output signal is of interest for the user. The amplitude of the control signal during switching off of that transistor then becomes higher. The edge steepness of the output signal during turn-on of the transistor is thus reduced to such an extent that the pulse has an sufficiently small overshoot. This also results in the edge becoming steeper during turn-off of the transistor, because the turn-off time becomes somewhat slower due to the physical conditions. As a result of applying the second offset voltage, the symmetry line of the control pulse is shifted, the symmetry line being defined by the middle between the "high" and "low" levels, relative to the zero line at which the differential amplifier reverses polarity. As a result, the leading edge and the trailing edge of the output pulse do not intersect, as is required, in the middle between the "high" and "low" levels. By applying the first offset voltage to an input of the first differential amplifier stage, the pulse-duty ratio of the differential signal generated by the first differential amplifier stage can be varied without changing the output level. Because this differential signal is employed for driving the second differential amplifier stage, the leading and the trailing edges of the output signal are chronologically shifted by varying this pulse-duty ratio of the differential signal so that the leading and the trailing edges intersect exactly in the middle between the "high" and "low" levels in the desired manner.

The setting of the first offset voltage source and the second offset voltage source can be respectively undertaken via two potentiometers. The circuit can thus be matched to different output loads in a simple manner. Moreover, the component tolerances, imprecisions in the circuit design, and the influence of parasites effects (bonding wires, housing, etc.) caused by the mounting and packaging technology can be compensated.

For a given application with small tolerances and mounting and packaging, the potentiometers can be replaced by fixed-value resistors integrated on a chip with the remainder of the circuit.

The circuit arrangement of the invention also enables symmetrical pulse shapes to be achieved in driver stages containing differential amplifiers constructed in bipolar technology. Given the use of bipolar transistors, overshoots due to the physical conditions cannot be avoided if one wishes to achieve steep pulse edges.

The first differential amplifier stage and the second differential amplifier stage each include means for level shifting and decoupling and a differential amplifier. The respective differential amplifiers provided in the first and second differential amplifier stages can be limiting, emitter-coupled differential amplifiers which are cascaded. The means for level shifting and decoupling may be formed by three emitter-follower pairs connected in sequence. It is possible, however, to employ fewer or more emitter-follower pairs.

For setting the amplitude of the pulse at the first output of the second differential amplifier stage, the differential amplifier in that stage and the emitter-follower pair connected immediately preceding that differential amplifier can be supplied by a controllable constant current source. The amplitude of the generated pulse can be changed by setting the current at the differential amplifier in the second stage. In order to avoid an unfavorable deformation of the pulse, the current at the emitter-follower pair which is connected immediately preceding this differential amplifier is simultaneously varied, so that the ratio of the currents to the emitter-follower pair and to the differential amplifier remains approximately constant. As a result of this technique, the optimized pulse shape is retained even when the amplitude is varied, and thus the symmetry of the output pulse is preserved. The ability to set or adjust the amplitude of the pulse is of particular interest for use in the operation of laser diodes, because laser diodes having respectively different operating tolerances will likely be encountered and such tolerances must be compensated, and moreover a laser diode as it ages requires an increasingly higher pulse amplitude to produce the same output power.

It is also possible to supply the differential amplifier in the first differential amplifier stage, and the emitter-follower pair connected immediately preceding this differential amplifier, with an adjustable constant current source. The pulse shape of the output signal of the differential amplifier in the second stage can be further influenced by matching the currents through the differential amplifier in the first stage and through the emitter-follower pair immediately preceding the differential amplifier in the first stage. Pulse-shaped deviations due to process and design tolerances in the circuit as well as in the load at the output can be compensated in this manner. In particular, the edge steepness and the time jitter of the output signal can be further minimized in this manner.

If the user (load) is connected to the first output of the differential amplifier in the second stage via a transmission line having a characteristic impedance Z, the load having a resistance $R_L(<Z)$, a resistor having a resistance $R_S=Z-R_L$ can then be connected between the load and the end of the line. A reflection-free line termination is achieved in this manner as long as $R_L$, is ohmic and frequency-independent.

If the load is a laser diode, this represents a non-linear and frequency-dependent impedance. An exact matching, therefore, cannot be achieved by the interposition of an ohmic resistor $R_S$. In order to reduce double reflections resulting therefrom, the first output, and (for symmetry reasons) the output of the differential amplifier in the second stage complementary thereto, are each terminated with a resistor $R_Q$. The resistor $R_Q$, however, must be dimensioned by taking certain compromises into account. For example, it is preferable to dimension the resistor $R_Q$ so that the reflection coefficient at the first output of the differential amplifier in the second stage is halved. This results, however, in a reduction in the switching speed and an increase in the dissipated power, however, these will still remain within acceptable limits.

DESCRIPTION OF THE PREFERRED EMBODIMENTS

Figure 1:
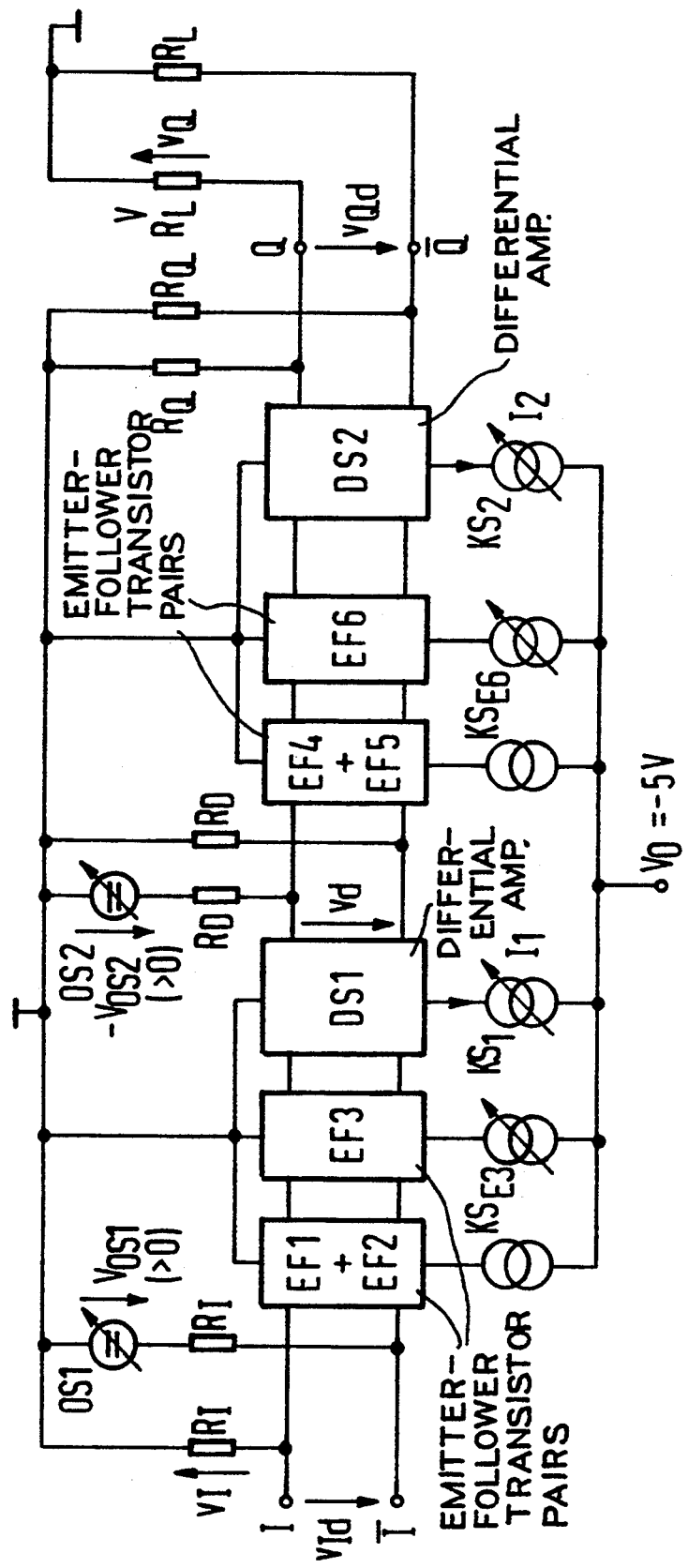
FIG. 1 is a block circuit diagram of an output stage for a driver circuit constructed in accordance with the principles of the present invention.
Figure 2:
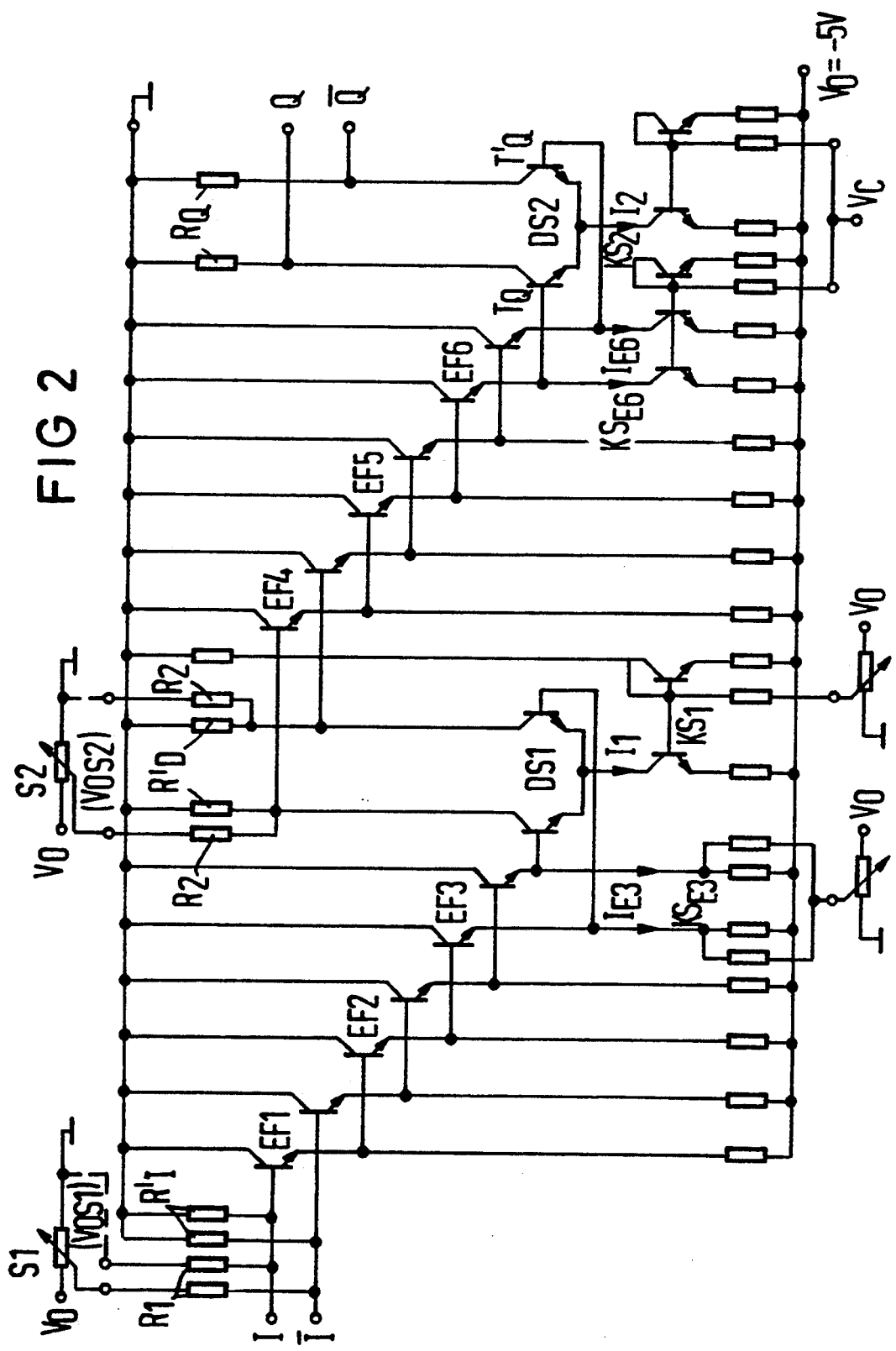
FIG. 2 is a circuit diagram of the output stage of FIG. 1.

An output stage for a driver circuit constructed in accordance with the principles of the present invention is shown in block diagram form in FIG. 1, and a complete circuit diagram for the same circuit is shown in FIG. 2. In FIG. 1, ideal offset voltages OS1 and OS2 are shown which respectively generate offset voltage $V_{OS1}$ and $V_{OS2}$. These voltages $V_{OS1}$ and $V_{OS2}$, indicated schematically in FIG. 1 are obtained in the circuit diagram of FIG. 2 from the supply voltage $V_O$ with potentiometers and the series resistors $R_1$ and $R_2$. AS a result of $R_1$ being much larger than $R_1'$ and $R_2$ being much larger than $R_D'$ (see FIG. 2), $R_1$ is approximately equal to $R_1'$ and $R_D$ is approximately equal to $R_D'$ (see FIG. 1).

The circuit arrangement contains a first limiting differential amplifier stage and a second limiting differential amplifier stage. The first differential amplifier stage is formed by a first emitter-follower pair EF1, a second emitter-follower pair EF2, a third emitter-follower pair EF3 and a first differential amplifier DS1, as shown in FIG. 1. The emitter terminals of the first emitter-follower pair EF1 are connected to the respective base terminals of the second emitter-follower pair EF2. The emitter terminals of the second emitter-follower pair EF2 are connected to the respective base terminals of the third emitter-follower pair EF3. The emitter terminals of the third emitter-follower pair EF3 are respectively connected to the base terminals of the emitter-coupled transistor pair of the first differential amplifier DS1, as shown in FIG. 2.

The first differential amplifier stage has an input I and a complementary input $\bar{I}$. The complementary input $\bar{I}$ is connected via the equivalent input resistance $R_1$ to a first (ideal) offset voltage source OS1, as shown in FIG. 1. The inputs I and $\bar{I}$ are respectively connected to the base terminals of the first emitter-follower pair EF1. The resistances $R_1$ may be selected equal to the characteristic impedance of the driving line so as to obtain a reflection-free line termination.

The emitter terminals of the third emitter-follower pair are connected to a controllable constant current source $KS_{E3}$.

The first differential amplifier DS1 may be formed, for example, by a pair of bipolar transistors having respective emitter terminals connected together. The emitter terminals of the transistor pair of the first differential amplifier DS1 are connected to an adjustable constant current source $KS_1$. The collector terminals of this transistor pair of the first differential amplifier DS1 form the output of the first differential amplifier stage.

The second differential amplifier stage includes a fourth emitter-follower pair EF4, a fifth emitter-follower pair EF5, a sixth emitter-follower pair EF6 and a second differential amplifier DS2. The inputs of the second differential amplifier stage are formed by the base terminals of the fourth emitter-follower pair EF4. The emitter terminals of the fourth emitter-follower pair EF4 are connected to the respective base terminals of the fifth emitter-follower pair EF5. The emitter terminals of the fifth emitter-follower pair EF5 are connected to the respective base terminals of the sixth emitter-follower pair EF6. The emitter terminals of the sixth emitter-follower pair EF6 are respectively connected to the base terminals of the transistor pair forming the second differential amplifier DS2. This transistor pair includes a first transistor $T_Q$ and a second transistor $T_Q'$.

The inputs of the second differential amplifier stage are respectively connected to the outputs of the first differential amplifier stage. A first input of the second differential amplifier stage is connected via a resistance $R_D$ to a second (ideal) offset voltage source OS2, as shown in FIG. 1. A second input of the second differential amplifier stage is connected via a resistance $R_D$ to ground. The resistances $R_D$ are the load resistors of the first differential amplifier DS1.

The emitter terminals of the sixth emitter-follower pair EF6 are connected to a controllable constant current source $KS_{E6}$. The respective emitter terminals of the first transistor $T_Q$ and the second transistor $T_Q'$ are connected together in the second differential amplifier stage DS2. The respective emitter terminals of these transistors are connected to a controllable constant current source $KS_2$. The constant current source $KS_{E6}$ which feeds the sixth emitter-follower pair EF6 and the constant current source $KS_2$ which feeds the second differential amplifier DS2 are interconnected so that the current $I_{E6}$ for the sixth emitter-follower pair EF6 changes given a change in the current $I_2$ for the second differential amplifier DS2 so that the ratio $I_2/I_{E6}$ is maintained approximately constant.

The respective collector terminals of the first transistor $T_Q$ and the second transistor $T_Q'$ form the first output Q and the second output $\bar{Q}$; complementary thereto, of the second differential amplifier stage. In single-ended operation, only the first output Q is loaded by a user V. The user V may be, for example, a laser diode, possibly having a series resistance. The first output Q and the second output $\bar{Q}$ are respectively terminated with a resistance $R_Q$ to reduce double reflections given the drive of the load via a line. The value of the resistance $R_Q$ can be selected so as to be two to three times the characteristic impedance of the line in order to achieve an acceptable compromise of the output parameters. The first and second offset voltages $V_{OS1}$ and $V_{OS2}$ are shown in FIG. 2 as being obtained from respective first and second offset voltage sources S1 and S2, each formed by a potentiometer connected between the supply voltage $V_0$ and ground. The resistances $R_1$ and $R_2$ are dimensioned so as to be large in comparison to the respective internal resistances of the offset voltage sources S1 and S2. As a result, the first offset voltage $V_{OS1}$ and second offset voltage $V_{OS2}$ are independent of temperature.

The constant current sources $KS_{E3}$ and $KS_1$ also include respective potentiometers. The first offset voltage $V_{OS1}$, the second offset voltage $V_{OS2}$, the current $I_{E3}$ through the third emitter-follower EF3 and the current $I_1$ through the first differential amplifier DS1 can thus be externally set. By contrast, the current sources $KS_{E6}$ and $KS_2$ in the example of FIG. 2 are driven by a common external control voltage $V_C$ which permits the current $I_{E6}$ through the sixth emitter-follower pair EF6 and the current $I_2$ through the second differential amplifier to be regulated.

The circuit arrangement is operated with a supply voltage $V_0$ of $-5$ volts.

During operation, a signal $V_{Id}$ (see FIG. 1) is applied across the inputs of the first differential amplifier stage. The signal $V_{Id}$ can be a differential signal or a single-ended signal. This results in a signal $v_d$ at the outputs of the first differential amplifier stage. The second differential amplifier stage is driven with the differential signal $v_d$. A differential signal $v_{Qd}$ then arises at the output of the second differential amplifier stage between the first output Q and the second output $\bar{Q}$. A single-ended signal $v_Q$ is present at the first output Q. This signal is used for driving the user V.

During operation of the circuit, the second offset voltage $V_{OS2}$ is first set so that the originally existing, pronounced overshoots of the single-ended signal $v_Q$, which are caused by the overshoots in the output current, are substantially eliminated. For that purpose, the second offset voltage $V_{OS2}$ is selected so that the amplitude of the control voltage becomes lower when the first transistor $T_Q$, which is connected to the first output Q, is switched on. When the transistor $T_Q$ is switched off, the amplitude of the control voltage of the first transistor $T_Q$ then becomes larger. Subsequently, the first offset voltage $V_{OS1}$ is set so that the changes in the pulse-duty ratio of the differential signal $v_d$ associated therewith shift the signal edges of the output signal $v_Q$ so that they intersect in the middle between the "high" and "low" levels (i.e., on the symmetry line). For that purpose, it is necessary that the first offset voltage $V_{OS1}$ and the second offset voltage $V_{OS2}$ have operational signs opposite to each other, when these voltages are defined as shown in FIG. 1.

Figure 3:
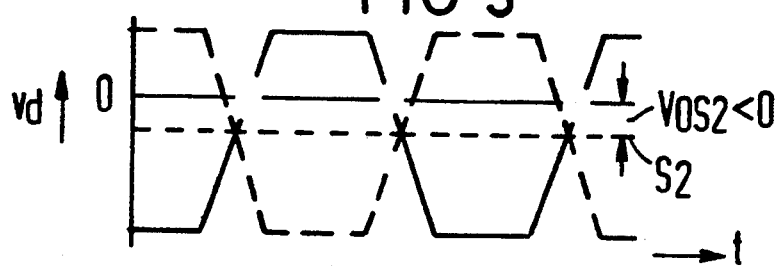
FIG. 3 is a graph showing the influence of the second offset voltage on the signal at the input of the second differential amplifier stage.

The qualitative influence of the second offset voltage $V_{OS2}$ on the shift of the symmetry line $S_2$ of the differential signal $v_d$ relative to the zero line is shown in FIG. 3.

Figure 4:
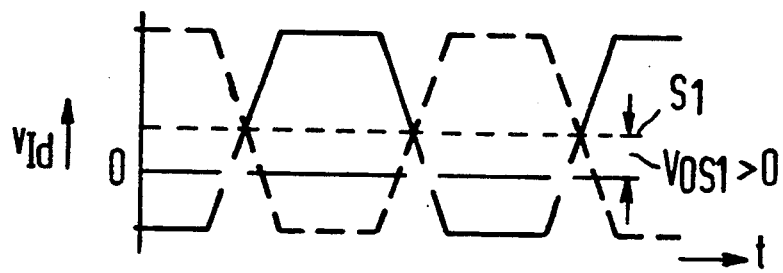
FIG. 4 is a graph showing the influence of the first offset voltage on the input signal of the driver circuit.

The qualitative influence of the first offset voltage $V_{OS1}$ on the shift of the symmetry line $S_1$ of the input signal $v_{Id}$ relative to the zero line is shown in FIG. 4, wherein $v_{Id}$ is shown, as an example, as a differential signal.

The circuit arrangement can be realized, for example, using bipolar transistors which are manufactured using a self-aligned double polysilicon technology with trench insulation employing a 0.8 μm lithography. Such bipolar transistors have an effective emitter width of 0.4 μm.

Pulse sequences with data rates up to 20 Gbit/s can be processed with the circuit arrangement disclosed herein and currently available bipolar technologies.

Figure 5A:
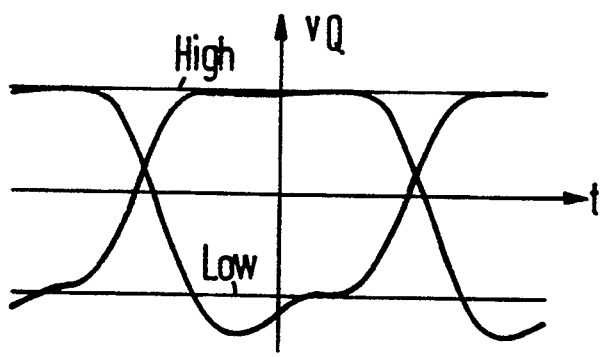
FIG. 5a and 5b are graphs respectively showing the output signal without and with the application of the offset adjustment in accordance with the principles of the present invention.
Figure 5B:
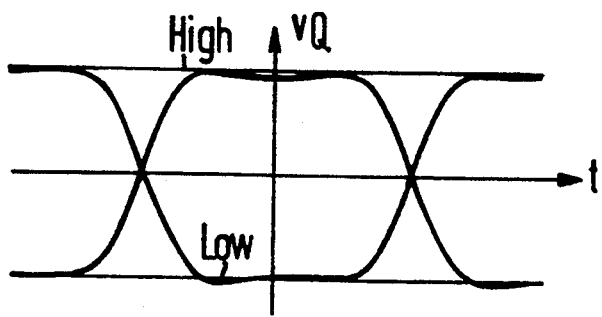

The simulation results for such an integrated circuit are shown in FIG. 5. The eye pattern of the output signal $v_Q$ for a data rate of 10 Gbit/s is shown in FIG. 5a, wherein the above-described adjustments using the offset voltages have not yet been undertaken. As can be seen, the pulse shape is asymmetrical and has pronounced undershoots. The significant improvement in the symmetry of the pulse shape and the minimization of the undershoots, as a result of the use of the circuit described above in accordance with the principles of the present invention can be seen in the eye pattern for the same signal in FIG. 5b.

Although modifications and changes may be suggested by those skilled in the art, it is the intention of the inventor to embody within the patent warranted hereon all changes and modifications as reasonably and properly come within the scope of his contribution to the art.

I claim as my invention:

1. An output stage for a driver circuit comprising:
   first and second, sequentially connected, limiting differential amplifier stages;
   each of said first and second differential amplifier stages having two transistors, each transistor having a turn-on voltage and turn-off voltage, the two transistors in each differential amplifier stage being interconnected to form a differential amplifier transistor pair, and said first and second differential amplifier stages each having two complementary inputs and two complementary outputs;
   said first differential amplifier stage, when driven by an input signal, generating a differential signal having a pulse-duty ratio and said second differential amplifier stage being driven by said differential signal to generate an output signal at a first of its two outputs and a complementary output signal at its other output, said first of said two outputs being connectable to a load;
   first adjustable offset voltage source means, connected to an input of said first differential amplifier stage, for varying said pulse-duty ratio of said differential signal; and
   second adjustable offset voltage source means, connected to an input of said second differential amplifier stage, for decreasing the turn-on voltage of a first of said two transistors in said second differential amplifier stage and for simultaneously increasing the turn-off voltage of said first of said two transistors.

2. An output stage as claimed in claim 1 further comprising:
   a line connected between said first of said two outputs of said second differential amplifier stage and said load, said line having a characteristic impedance Z; and
   a resistance $R_s = Z - R_L$ connected between said load and an end of said line, wherein $R_L$ ($<Z$) is the resistance of said load.

3. An output stage as claimed in claim 1 further comprising resistances respectively terminating said two complementary outputs of said second differential amplifier stage, in addition said load connectable to said first of said two complementary outputs.

4. An output stage as claimed in claim 1 wherein said first of said two outputs of said differential amplifier stage is connected to a laser diode as said load.

5. An output stage as claimed in claim 1 wherein said differential amplifier transistor pair in said first differential amplifier stage forms a first differential amplifier and wherein said differential amplifier transistor pair in said second differential amplifier stage forms a second differential amplifier, and wherein said output stage further comprises:
   first means for level shifting and decoupling connected between said inputs of said first differential amplifier stage and said first differential amplifier; and
   second means for level shifting and decoupling connected between said inputs of said second differential amplifier stage and said second differential amplifier.

6. An output stage as claimed in claim 5 wherein each of said first and second differential amplifiers is a limiting, emitter-coupled differential amplifier, and wherein each of said first and second means for level shifting and decoupling includes at least one series-connected emitter-follower transistor pair.

7. An output stage as claimed in claim 6 wherein said first means for level shifting and decoupling includes an emitter-follower transistor pair connected immediately preceding said first differential amplifier, and wherein said first differential amplifier stage further includes:
   a first adjustable constant current source feeding said emitter-follower transistor pair connected immediately preceding said first differential amplifier; and
   a second adjustable constant current source feeding said first differential amplifier.

8. An output stage as claimed in claim 6 wherein said second means for level shifting and decoupling includes an emitter-follower transistor pair connected immediately preceding said second differential amplifier, and said second differential amplifier stage further including:
   a first controllable constant current source feeding said emitter-follower pair connected immediately preceding said second differential amplifier; and a second controllable constant current source feeding said second differential amplifier.

9. An output stage as claimed in claim 8 further comprising:
external voltage source means, connected to each of said first and second controllable constant current sources for controlling said first and second controllable constant current sources with a common voltage and with a constant relationship of the respective currents generated by said first and second controllable constant current sources.

* * * * *